(12) United States Patent
Liu et al.

(10) Patent No.: US 10,274,376 B2
(45) Date of Patent: Apr. 30, 2019

(54) SYSTEM FOR TESTING THERMAL RESPONSE TIME OF UNCOOLED INFRARED FOCAL PLANE DETECTOR ARRAY AND METHOD THEREFOR

(71) Applicant: University of Electronic Science and Technology of China, Chengdu, Sichuan (CN)

(72) Inventors: Ziji Liu, Sichuan (CN); Shengchen Zhao, Sichuan (CN); Zhiqing Liang, Sichuan (CN); Hongbo Zhang, Sichuan (CN); Tao Wang, Sichuan (CN); Yadong Jiang, Sichuan (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 0 days.

(21) Appl. No.: 15/968,758

(22) Filed: May 2, 2018

(65) Prior Publication Data
US 2018/0252590 A1    Sep. 6, 2018

(30) Foreign Application Priority Data

Jun. 26, 2017    (CN) .......................... 2017 1 0496167

(51) Int. Cl.
*G01J 5/52* (2006.01)
*G01J 5/10* (2006.01)
(Continued)

(52) U.S. Cl.
CPC ................ *G01J 5/522* (2013.01); *G01J 5/10* (2013.01); *G01R 31/2656* (2013.01); *G01J 2005/0048* (2013.01)

(58) Field of Classification Search
CPC ....... G01J 5/522; G01J 5/10; G01J 2005/0048
(Continued)

(56) References Cited

U.S. PATENT DOCUMENTS

| 4,885,463 | A | * | 12/1989 | Wellman | ............ | G01R 31/2656 |
| | | | | | | 250/252.1 |
| 4,907,895 | A | * | 3/1990 | Everest | .................... | G01J 5/62 |
| | | | | | | 356/43 |

(Continued)

*Primary Examiner* — David P Porta
*Assistant Examiner* — Gisselle M Gutierrez

(57) ABSTRACT

A system for testing thermal response time of an uncooled infrared focal plane detector array and a method therefor is provided. The system comprises: a blackbody, a chopper, a detector unit under test and a testing system. The method comprises: emitting radiation by the blackbody, chopping by the chopper, then radiating the radiation to the uncooled infrared focal plane detector array under test; generating different responses on the radiation at different chopping frequencies by the uncooled infrared focal plane detector array under test; collecting different response values of the uncooled infrared focal plane detector array under test at different chopping frequencies; obtaining response amplitude at a corresponding frequency in a frequency domain by FFT; fitting according to a formula $$Rv(f) = \frac{Rv(0)}{\sqrt{1+(2\pi f\tau)^2}}$$

to obtain the thermal response time.

4 Claims, 3 Drawing Sheets

(51) Int. Cl.
  *G01R 31/265*   (2006.01)
  *G01J 5/00*     (2006.01)
(58) Field of Classification Search
  USPC ....................................................... 250/252.1
  See application file for complete search history.

(56) References Cited

U.S. PATENT DOCUMENTS

| | | | | |
|---|---|---|---|---|
| 5,751,830 | A * | 5/1998 | Hutchinson | G01S 17/89 |
| | | | | 382/103 |
| 6,585,410 | B1 * | 7/2003 | Ryan | G01J 5/522 |
| | | | | 250/252.1 |
| 8,507,867 | B1 * | 8/2013 | Clement | G07C 9/00896 |
| | | | | 250/349 |
| 2009/0321639 | A1 * | 12/2009 | Yoon | G01J 5/08 |
| | | | | 250/338.1 |
| 2015/0330837 | A1 * | 11/2015 | Liberati | G01J 3/443 |
| | | | | 250/339.05 |
| 2017/0276548 | A1 * | 9/2017 | Smith | G01J 5/0003 |

* cited by examiner

SYSTEM FOR TESTING THERMAL RESPONSE TIME OF UNCOOLED INFRARED FOCAL PLANE DETECTOR ARRAY AND METHOD THEREFOR

CROSS REFERENCE OF RELATED APPLICATION

The present application claims priority under 35 U.S.C. 119(a-d) to CN 201710496167.5, filed Jun. 26, 2017.

BACKGROUND OF THE PRESENT INVENTION

Field of Invention

The present invention relates to the technical field of an infrared detector, and more particularly to a system for testing thermal response time of an uncooled infrared focal plane detector array.

Description of Related Arts

Uncooled infrared focal plane array technology is the main developing trend of the infrared technology at present. Due to the characteristics of small size, light weight, high cost effective and low power consumption, uncooled infrared focal plane detector are widely applied in military, industrial, medical, scientific research and environmental monitoring and other fields are widely used. Thermal response time is an important parameter for measuring uncooled infrared focal plane detector performance. When the incident radiation to the detector changes, the output of the detector needs a certain time to rise or fall to a steady value corresponding to the radiated power.

The shorter is the response time of the uncooled infrared focal plane detector, the more sensitive is to changes of incident radiation and the broader is the application. Therefore, accurately measuring the thermal response time of the uncooled infrared focal plane detector is of great importance for evaluating the performance of infrared focal plane detector, improving the design and manufacture and the technological level of the detector, as well as clarifying the applicable scope of the detector. However, at present, the acquisition of thermal response time mainly depends on simulation or evaluation method with low accuracy. Due to the lack of various material parameters and the instability of the process, the difference between the design parameter and the measured parameter is large, and the design parameter is not capable of guiding parameters regulation during the process.

SUMMARY OF THE PRESENT INVENTION

In view of all the drawbacks in the conventional art, an object of the present invention is to provide an accurate and reliable system for testing thermal response time of an uncooled infrared focal plane detector array and a method therefor.

In order to achieve the object mentioned above, technical solutions adopted by the present invention are as follows.

A system for testing thermal response time of an uncooled infrared focal plane detector array, comprises: a blackbody, a chopper, a detector unit under test and a testing system; wherein the detector unit under test comprises an uncooled infrared focal plane detector array under test and an adapter plate; a center of a radiating surface of the blackbody directly faces a center of the optical lens; the center of the blackbody directly faces a center of the uncooled infrared focal plane detector array under test, the chopper is provided between the blackbody and the detector unit under test; the system for testing thermal response time of the uncooled infrared focal plane detector array controls status of the blackbody, the chopper and the detector unit by external interfaces provided on the blackbody, the chopper and the detector unit; output data of the detector under test is transmitted to the system for testing by a data acquisition card.

Preferably, the system further comprises an optical lens, wherein the optical lens is provided on a front portion of the uncooled infrared focal plane detector array under test; a center of a radiating surface of the blackbody directly faces a center of the optical lens.

Preferably, the blackbody is a chamber black body or an extend blackbody.

In order to achieve the objects mentioned above, the present invention further provides a method for testing the thermal response time of the uncooled infrared focal plane detector array, which tests by utilizing the system mentioned above; wherein the method comprises steps of:

emitting radiation by the blackbody, chopping by the chopper, then radiating the radiation to the uncooled infrared focal plane detector array under test; generating different responses on the radiation at different chopping frequencies by the uncooled infrared focal plane detector array under test; collecting different response values of the uncooled infrared focal plane detector array under test at different chopping frequencies; obtaining response amplitude at a corresponding frequency in a frequency domain by Fast Fourier Transform (FFT); fitting according to a formula $$Rv(f) = \frac{Rv(0)}{\sqrt{1 + (2\pi f \tau)^2}}$$

to obtain the thermal response time; wherein $R_V(f)$ represents a response amplitude corresponding to a frequency f after FFT, $R_V(0)$ is a DC (direct current) response amplitude, $\tau$ is the thermal response time; f is a chopping frequency of the chopper.

Preferably, the method for testing the thermal response time of the uncooled infrared focal plane detector array, comprises steps of:

step (1): measuring DC response of the detector after the detector unit under test is stably powered on, setting a frame frequency of the detector unit to be 50 Hz; covering the detector unit completely with an object at a normal temperature, detecting and recording an output $V_L$ of the detector unit at a first moment; denoting a radiating temperature of the blackbody as T, wherein T is higher than a normal temperature; when the radiating temperature of the blackbody is stable, the detector unit under test is aligned with the blackbody, detecting and recording an output $V_0$ of the detector unit at a second moment; in order to prevent that the blackbody is not capable of radiating on all array of the detector, getting M×N pixels from a central zone of a plane array to calculate an average value, $$\overline{V}_L = \frac{\sum_{i=1}^{M}\sum_{j=1}^{N} V_L(i,j)}{M \times N}, \overline{V}_0 = \frac{\sum_{i=1}^{M}\sum_{j=1}^{N} V_0(i,j)}{M \times N};$$

calculating the DC response of the detector unit $Rv=\overline{V_0}-\overline{V_L}$;

step (2) measuring response of the detector under different chopping frequencies denoting a working frequency of the detector unit under test as $f_0$ Hz; chopping radiation outputted by the blackbody with the chopper; wherein a chopping frequency of the chopper is not higher than $$\frac{f_0}{2} Hz;,$$

collecting data outputted by the detector unit under different chopping frequencies; continuously collecting N*f frames in each group, wherein N≥2; performing Fast Fourier Transform (FFT) on the data under different chopping frequencies, so as to obtain a response amplitude $V_f$ under a corresponding frequency in a frequency domain; selecting M×N pixels in an identical area of the step (1) to calculate an average value, $$\overline{V_f} = \frac{\sum_{i=1}^{M}\sum_{j=1}^{N} V_f(i,j)}{M \times N};$$

calculating a response of the detector unit under different chopping frequencies, $Rv(f)=\overline{V_f}-\overline{V_L}$;

step (3) fitting curve according to a formula $$Rv(f) = \frac{Rv(0)}{\sqrt{1+(2\pi f \tau)^2}}$$

to calculate a thermal response time τ;

according to the Rv(f) measured and calculated under different frequencies f in the step (2); taking Rv(0) and τ as unknown parameters, fitting curve according to a formula $$Rv(f) = \frac{Rv(0)}{\sqrt{1+(2\pi f \tau)^2}}$$

to calculate the thermal response time τ; taking a DC response Rv of the detector unit as an initial value of Rv(0) while fitting.

Preferably, an initial value of τ in the step (3) is 0.01 s.

Preferably, calculations in the steps (1)-(3) are eliminated out of blind elements.

Beneficial effects of the present invention are as follows. (1) The method adopts an FFT (Fast Fourier Transform) method to effectively eliminate the influence of noise on the thermal response time test, the measurement accuracy is high and the test result is stable and reliable. (2) The method is capable of performing the test by utilizing the blackbody, the chopper and other standard equipment, the test has a short time, high feasibility and high efficiency.

Reference numbers: 1—chamber blackbody; 2—chopper; 3—optical lens; 4—detector unit under test; 5—testing system

DETAILED DESCRIPTION OF THE PREFERRED EMBODIMENT

The embodiments of the present invention are described by using specific embodiments as follows. One skilled in the art can easily understand other advantages and effects of the present invention from the contents disclosed in this specification. The present invention may also be implemented or applied through different specific embodiments. Details in the specification may also be variously modified or changed based on different perspectives and applications without departing from the spirit of the present invention.

Figure 2:
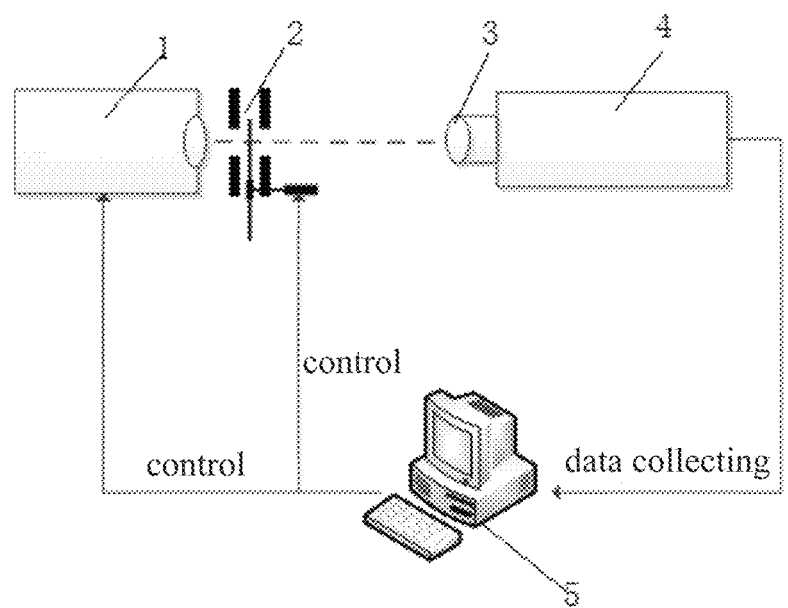
FIG. 2 is a schematic view of a thermal response time test platform according to a preferred embodiment of the present invention.

As shown in FIG. 2, a system for testing thermal response time of an uncooled infrared focal plane detector array comprises: a chamber blackbody 1, a chopper 2, a detector unit under test 4 and a testing system 5; wherein the detector unit under test 5 comprises an uncooled infrared focal plane detector array under test, an adapter plate, an optical lens 3; wherein the optical lens 3 is provided on a front portion of the uncooled infrared focal plane detector array under test; a center of a radiating surface of the blackbody directly faces a center of the optical lens; the center of the blackbody directly faces a center of the uncooled infrared focal plane detector array under test, the chopper is provided between the blackbody and the detector unit under test; the blackbody is a chamber black body or an extend blackbody; the system for testing thermal response time of the uncooled infrared focal plane detector array controls status of the blackbody, the chopper and the detector unit by external interfaces provided on the chopper and the detector unit; output data of the detector under test is transmitted to the system for testing by a data acquisition card.

Figure 1:
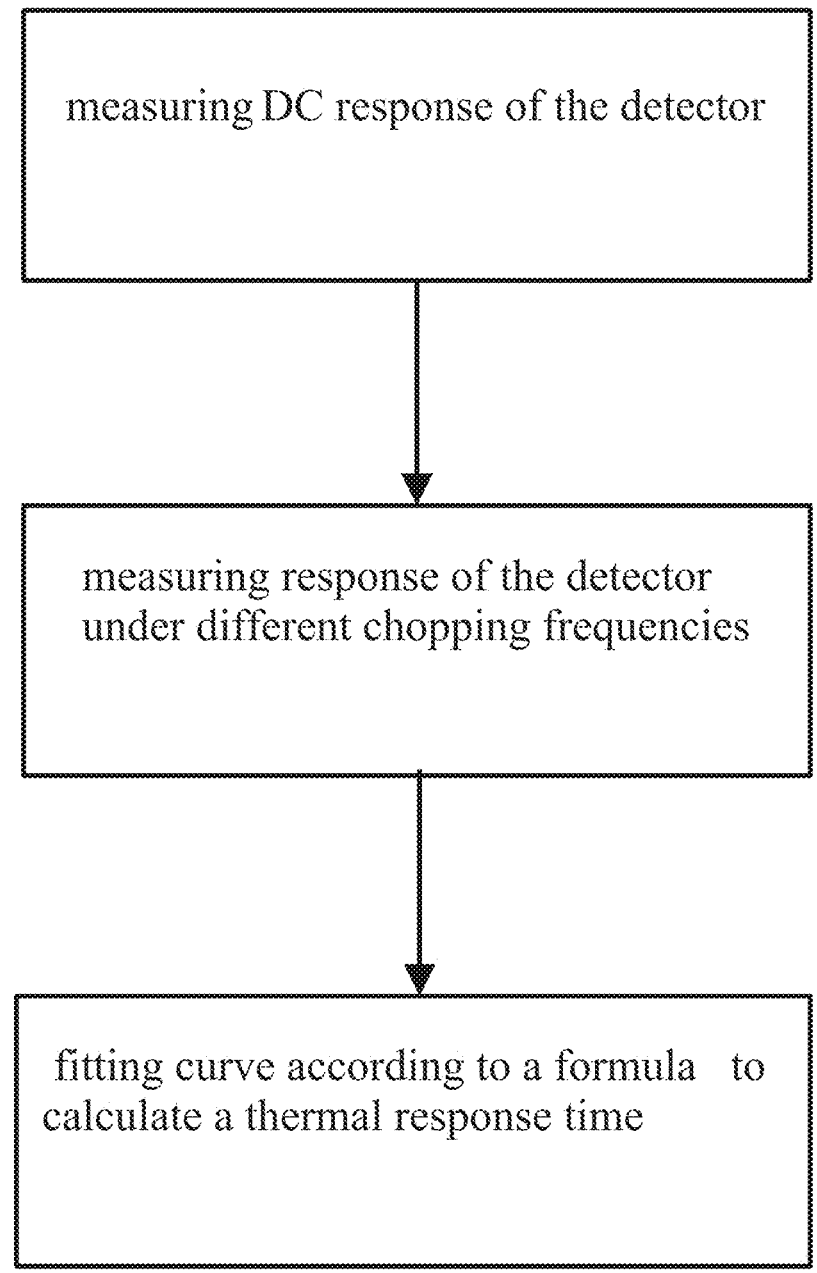
FIG. 1 is a flow chart of a thermal response time of an uncooled infrared focal plane detector array tested according to a preferred embodiment of the present invention.

FIG. 1 is a flow chart of a thermal response time of an uncooled infrared focal plane detector array tested according to a preferred embodiment of the present invention.

The preferred embodiment further provides a method for testing the thermal response time of the uncooled infrared focal plane detector array, which tests by utilizing the system mentioned above; wherein the method comprises steps of:

emitting radiation by the blackbody, chopping by the chopper, then radiating the radiation to the uncooled infrared focal plane detector array under test; generating different responses on the radiation at different chopping frequencies by the uncooled infrared focal plane detector array under test; collecting different response values of the uncooled infrared focal plane detector array under test at different chopping frequencies; obtaining response amplitude at a corresponding frequency in a frequency domain by Fast Fourier Transform (FFT); fitting according to a formula $$Rv(f) = \frac{Rv(0)}{\sqrt{1+(2\pi f \tau)^2}}$$

to obtain the thermal response time; wherein $R_V(f)$ represents a response amplitude corresponding to a frequency f after FFT, $R_V(0)$ is a DC (direct current) response amplitude, τ is the thermal response time; f is a chopping frequency of the chopper.

Specifically, the method further following steps of:

step (1): setting up test platform according to FIG. 2, connecting devices of the chamber blackbody; the chopper; the detector unit comprising a detector under test, an adapter plate and an optical lens; and a test system in a PC (personal computer); regulating a distance between the chamber blackbody and the detector unit under test to ensure that a distance between a blackbody radiating surface of the chamber blackbody and a plane of the optical lens allows a focused image to be clear and the optical lens to be centered on the radiating surface; regulating a position of the chopper to ensure that blackbody radiation passed through the chopper is capable of being uniformly radiated to the detector unit under test, confirming, powering on and starting the devices;

step (2): measuring DC response of the detector after the detector unit under test is stably powered on, setting a frame frequency of the detector unit to be 50 Hz; covering the detector unit completely with an object at a normal temperature, detecting and recording an output $V_L$ of the detector unit at a first moment; denoting a radiating temperature of the blackbody as T, wherein T is higher than a normal temperature; when the radiating temperature of the blackbody is stable, the detector unit under test is aligned with the blackbody, detecting and recording an output $V_0$ of the detector unit at a second moment; in order to prevent that the blackbody is not capable of radiating on all array of the detector, getting M×N pixels from a central zone of a plane array to calculate an average value, $$\overline{V_L} = \frac{\sum_{i=1}^{M}\sum_{j=1}^{N} V_L(i,j)}{M \times N}, \overline{V_0} = \frac{\sum_{i=1}^{M}\sum_{j=1}^{N} V_0(i,j)}{M \times N};$$

calculating the DC response of the detector unit $Rv = \overline{V_0} - \overline{V_L}$;

step (3) measuring response of the detector under different chopping frequencies denoting a working frequency of the detector unit under test as $f_0$ Hz; chopping radiation outputted by the blackbody with the chopper; wherein a chopping frequency of the chopper is not higher than $$\frac{f_0}{2} Hz;,$$

collecting data outputted by the detector unit under different chopping frequencies; continuously collecting N*f frames in each group, wherein N≥2; performing Fast Fourier Transform (FFT) on the data under different chopping frequencies, so as to obtain a response amplitude $V_f$ under a corresponding frequency in a frequency domain; selecting M×N pixels in an identical area of the step (1) to calculate an average value, $$\overline{V_f} = \frac{\sum_{i=1}^{M}\sum_{j=1}^{N} V_f(i,j)}{M \times N};$$

calculating a response of the detector unit under different chopping frequencies, $Rv(f) = \overline{V_f} - \overline{V_L}$;

step (4) fitting curve according to a formula $$Rv(f) = \frac{Rv(0)}{\sqrt{1+(2\pi f \tau)^2}}$$

to calculate a thermal response time τ;

according to the Rv(f) measured and calculated under different frequencies f in the step (3); taking Rv(0) and τ as unknown parameters, fitting curve according to a formula $$Rv(f) = \frac{Rv(0)}{\sqrt{1+(2\pi f \tau)^2}}$$

to calculate the thermal response time τ; taking a DC response Rv of the detector unit as an initial value of Rv(0) while fitting; wherein an initial value of τ is 0.01 s.

Figure 3:
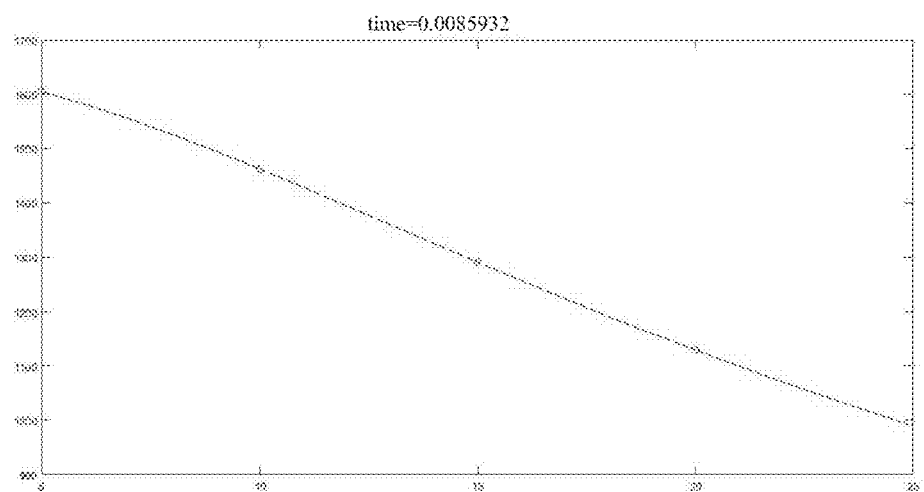
FIG. 3 is a fitting curve diagram of a result of the thermal response time test platform according to the preferred embodiment of the present invention.

FIG. 3 is a fitting curve, wherein a thermal response time is 8.6 ms.

Calculations in the steps mentioned above need eliminating blind elements.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A system for testing thermal response time of an uncooled infrared focal plane detector array, comprising: a blackbody, a chopper, a detector unit under test and a testing system; wherein the detector unit under test comprises an uncooled infrared focal plane detector array under test and an adapter plate; a center of a radiating surface of the blackbody directly faces a center of an optical lens; the center of the blackbody directly faces a center of the uncooled infrared focal plane detector array under test, the chopper is provided between the blackbody and the detector unit under test; the system for testing thermal response time of the uncooled infrared focal plane detector array controls status of the blackbody, the chopper and the detector unit by external interfaces provided on the blackbody, the chopper and the detector unit; data outputted by the detector under test is transmitted to the system for testing by a data acquisition card;

wherein the method comprises steps of:

emitting radiation by the blackbody, chopping by the chopper, then radiating the radiation to the uncooled infrared focal plane detector array under test; generating different responses on the radiation at different chopping frequencies by the uncooled infrared focal plane detector array under test; collecting different response values of the uncooled infrared focal plane detector array under test at different chopping frequencies; obtaining response amplitude at a corresponding frequency in a frequency domain by Fast Fourier Transform (FFT); fitting according to a formula $$Rv(f) = \frac{Rv(0)}{\sqrt{1+(2\pi f \tau)^2}}$$

to obtain the thermal response time; wherein $R_v(f)$ represents a response amplitude corresponding to a frequency f after FFT, $R_v(0)$ is a DC (direct current) response amplitude, $\tau$ is the thermal response time; f is a chopping frequency of the chopper.

2. The method for testing the thermal response time of the uncooled infrared focal plane detector array, as recited in claim 1, comprising steps of:

step (1): measuring DC response of the detector after the detector unit under test is stably powered on, setting a frame frequency of the detector unit to be 50 Hz; covering the detector unit completely with an object at a normal temperature, detecting and recording an output $V_L$ of the detector unit at a first moment; denoting a radiating temperature of the blackbody as T, wherein T is higher than a normal temperature; when the radiating temperature of the blackbody is stable, the detector unit under test is aligned with the blackbody, detecting and recording an output $V_O$ of the detector unit at a second moment; in order to prevent that the blackbody is not capable of radiating on all array of the detector, getting M×N pixels from a central zone of a plane array to calculate an average value, $$\overline{V_L} = \frac{\sum_{i=1}^{M}\sum_{j=1}^{N} V_L(i,j)}{M \times N}, \overline{V_0} = \frac{\sum_{i=1}^{M}\sum_{j=1}^{N} V_0(i,j)}{M \times N};$$

calculating the DC response of the detector unit $Rv=\overline{V}_0-\overline{V}_L$;

step (2) measuring response of the detector under different chopping frequencies denoting a working frequency of the detector unit under test as $f_0$ Hz; chopping radiation outputted by the blackbody with the chopper; wherein a chopping frequency of the chopper is not higher than $$\frac{f_0}{2} Hz;,$$

collecting data outputted by the detector unit under different chopping frequencies; continuously collecting N*f frames in each group, wherein N≥2; performing Fast Fourier Transform (FFT) on the data under different chopping frequencies, so as to obtain a response amplitude $V_f$ under a corresponding frequency in a frequency domain; selecting M×N pixels in an identical area of the step (1) to calculate an average value, $$\overline{V_f} = \frac{\sum_{i=1}^{M}\sum_{j=1}^{N} V_f(i,j)}{M \times N};$$

calculating a response of the detector unit under different chopping frequencies, $Rv(f)=\overline{V}_f-\overline{V}_L$;

step (3) fitting curve according to a formula $$Rv(f) = \frac{Rv(0)}{\sqrt{1+(2\pi f \tau)^2}}$$

to calculate a thermal response time $\tau$;

according to the Rv(f) measured and calculated under different frequencies f in the step (2); taking Rv(0) and 2 as unknown parameters, fitting curve according to a formula $$Rv(f) = \frac{Rv(0)}{\sqrt{1+(2\pi f \tau)^2}}$$

to calculate the thermal response time $\tau$; taking a DC response Rv of the detector unit as an initial value of Rv(0) while fitting.

3. The method for testing the thermal response time of the uncooled infrared focal plane detector array, as recited in claim 2, wherein an initial value of $\tau$ in the step (3) is 0.01 s.

4. The method for testing the thermal response time of the uncooled infrared focal plane detector array, as recited in claim 2, wherein calculations in the steps (1)-(3) are eliminated out of blind elements.

* * * * *